United States Patent
Heutling et al.

(10) Patent No.: US 9,951,411 B2
(45) Date of Patent: Apr. 24, 2018

(54) EROSION PROTECTION COATING

(75) Inventors: Falko Heutling, München (DE);
Thomas Uihlein, Dachau (DE);
Wolfgang Eichmann, Puchheim (DE)

(73) Assignee: MTU AERO ENGINES GmbH, Munich (DE)

( * ) Notice: Subject to any disclaimer, the term of this patent is extended or adjusted under 35 U.S.C. 154(b) by 884 days.

(21) Appl. No.: 12/988,045

(22) PCT Filed: Apr. 18, 2009

(86) PCT No.: PCT/DE2009/000533
§ 371 (c)(1),
(2), (4) Date: Nov. 8, 2010

(87) PCT Pub. No.: WO2009/129790
PCT Pub. Date: Oct. 29, 2009

(65) Prior Publication Data
US 2011/0045264 A1  Feb. 24, 2011

(30) Foreign Application Priority Data
Apr. 21, 2008  (DE) .................. 10 2008 019 891

(51) Int. Cl.
*B32B 7/02*  (2006.01)
*C23C 14/06*  (2006.01)
(Continued)

(52) U.S. Cl.
CPC ........ *C23C 14/0641* (2013.01); *C23C 14/027* (2013.01); *C23C 28/044* (2013.01);
(Continued)

(58) Field of Classification Search
USPC .................................. 428/216, 217
See application file for complete search history.

(56) References Cited

U.S. PATENT DOCUMENTS

2005/0047694 A1* 3/2005 Nozaki et al. ................ 384/492
2008/0318069 A1* 12/2008 Coddet et al. ................ 428/457
(Continued)

FOREIGN PATENT DOCUMENTS

DE  10056241 A1  5/2002
DE  10210839 A1  9/2002
(Continued)

OTHER PUBLICATIONS

Barshilia, Harish C. et al, "Nanolayered multilayer coatings of CrN/CrAlN prepared by reactive DC magnetron sputtering" Applied Surface Science, Elsevier, Amsterdam, NL, vol. 253, No. 11, Mar. 2, 2007 (Mar. 2, 2007), pp. 5076-5083, XP005911102 ISSN: 0169-4332 p. 5077, paragraph 2.
(Continued)

*Primary Examiner* — Tahseen N Khan
(74) *Attorney, Agent, or Firm* — Barlow, Josephs & Holmes, Ltd.

(57) ABSTRACT

The invention relates to an erosion protection coating (11), in particular, for gas turbine components, having a horizontally segmented and/or multi-layered construction. i.e., having at least one relatively hard layer (12) and having at least one relatively soft layer (13), wherein the relatively hard layer or each relatively hard layer as well as the relatively soft layer or each relatively soft layer are disposed on top of one another in an alternating manner, in such a way that an outer-lying layer, which forms an outer surface of the erosion protection coating, is formed as a relatively hard layer (12). According to the invention, the relatively hard layer or each relatively hard layer (12) as well as the relatively soft layer or each relatively soft layer (13) are formed as a ceramic layer in each case.

18 Claims, 1 Drawing Sheet

Figure 1:
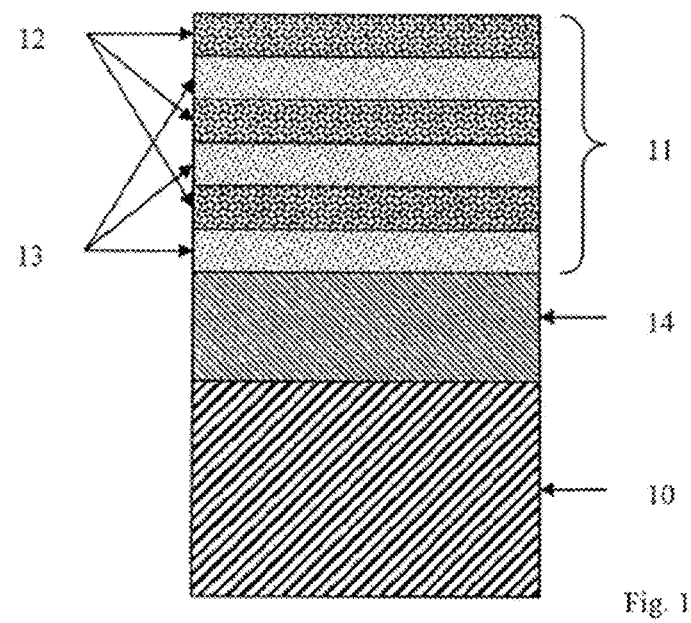

(51) Int. Cl.
  *C23C 14/02* (2006.01)
  *F01D 5/28* (2006.01)
  *C23C 28/04* (2006.01)
  *C23C 28/00* (2006.01)

(52) U.S. Cl.
  CPC ............ *C23C 28/048* (2013.01); *C23C 28/42* (2013.01); *F01D 5/284* (2013.01); *F01D 5/288* (2013.01); *F05D 2300/506* (2013.01); *Y10T 428/24975* (2015.01); *Y10T 428/24983* (2015.01)

(56) References Cited

U.S. PATENT DOCUMENTS

2009/0011195 A1* 1/2009 Bruce et al. .................. 428/174
2009/0123737 A1* 5/2009 Yasui et al. .................. 428/336

FOREIGN PATENT DOCUMENTS

| | | |
|---|---|---|
| DE | 10212383 A1 | 10/2003 |
| DE | 10343761 A1 | 4/2005 |
| DE | 102004001392 A1 | 8/2005 |
| DE | 102005030266 A1 | 1/2007 |
| DE | 102007050918 A1 | 4/2008 |
| DE | 102008020607 A1 | 11/2008 |
| DE | 102007027335 A1 | 12/2008 |
| DE | 112006003471 T5 | 12/2008 |
| EP | 1029114 A1 | 8/2000 |
| EP | 1775422 A1 | 4/2007 |
| JP | 2006037212 | 2/2006 |
| WO | 2005066384 A1 | 7/2005 |
| WO | 2005113175 A2 | 12/2005 |
| WO | 2007083361 A1 | 7/2007 |
| WO | WO 2007083361 A1 * | 7/2007 |
| WO | 2008042391 A2 | 4/2008 |
| WO | 2008119173 A1 | 10/2008 |
| WO | 2009026677 A1 | 3/2009 |

OTHER PUBLICATIONS

Okumiya M. et al., "Mechanical properties and tribological behavior of TiN—CrAlN and CrN—CrAlN multilayer coatings", Surface and Coatings Technology Elsevier Switzerland, vol. 112, No. 1-3, Feb. 1999 (Feb. 1999), pp. 123-128, XP002540894 ISSN: 0257-8972—whole document.

* cited by examiner

EROSION PROTECTION COATING

The invention relates to an erosion protection coating, in particular, for gas turbine components, according to the preamble of claim 1. In addition, the invention relates to a gas turbine component having an erosion protection coating according to the preamble of claim 5.

It is known from the prior art to provide gas turbine components with a coating that protects them from wear, this coating being formed as an erosion protection coating for the protection of these components from erosion on surfaces. Thus, erosion protection coatings with a horizontally segmented and/or a multi-layered construction, which comprise at least one relatively hard, ceramic layer and at least one relatively soft, metal layer, are known from the prior art. The ceramic layers as well as the metal layers of such multi-layered and/or horizontally segmented erosion protection coatings are disposed one on top of the other in an alternating manner, and in fact, in such a way that an outer-lying layer, which forms an outer surface of the erosion protection coating, is formed as a ceramic layer. Such multi-layered and/or horizontally segmented erosion protection coatings are also called multilayer coatings.

Such erosion protection coatings that are known from the prior art and that are constructed of alternating metal and ceramic layers provide a reduced erosion protection effect, particularly at operating temperatures between 500° C. and 700° C., especially at approximately 600° C., and also with small incident angles of erosion particles. Thus, there is a requirement for erosion protection coatings that guarantee a good erosion protection effect even when the components having erosion protection coatings are subjected to such operating conditions, as may occur particularly in the case of gas turbine components.

Proceeding from here, the problem of the present invention is based on creating a new type of erosion protection coating.

This problem is solved by an erosion protection coating in the sense of claim 1.

According to the invention, the relatively hard layer or each relatively hard layer and the relatively soft layer or each relatively soft layer of the erosion protection coating is formed as a ceramic layer in each case.

The present invention here proposes an erosion protection coating, which is formed from alternating relatively soft and relatively hard layers, wherein both the relatively hard layer or each relatively hard layer as well as the relatively soft layer or each relatively soft layer of the erosion protection coating is formed as a ceramic layer. The erosion protection coating in the sense of the invention is accordingly formed as a purely ceramic multilayer erosion protection coating.

The invention is based on the knowledge that the conventional metal layers of an erosion protection coating based on the prior art, at operating temperatures between 500° C. and 700° C., in particular, at approximately 600° C., induce a negative modification of the physical and mechanical properties of the erosion protection coating due to inter-diffusion and/or brittle phase formation, and thus extensively cause a reduction in the erosion protection effect.

Figure 2:
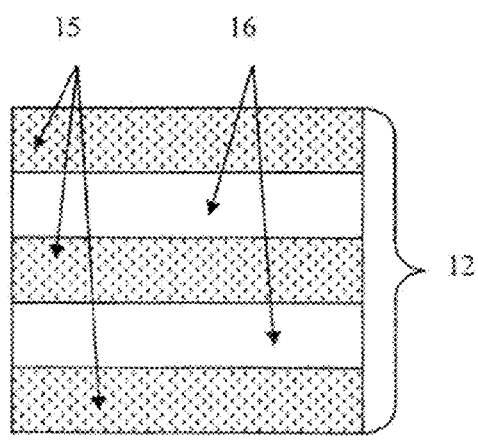
Figure 3:
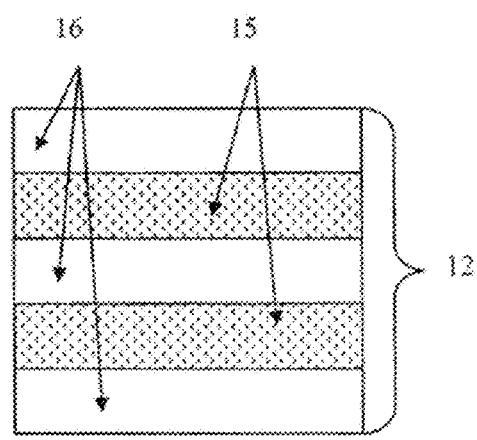

Preferred enhancements of the invention are taken from the subclaims and the following description. Embodiment examples of the invention will be explained in more detail based on the drawing, but are not limited thereto. Here:

FIG. 1: shows a schematized cross section through a gas turbine component according to the invention having an erosion protection coating according to the invention;

FIG. 2: shows a detail of the erosion protection coating according to FIG. 1; and FIG. 3: shows an alternative detail of the erosion protection coating according to FIG. 1.

The present invention relates to an erosion protection coating, in particular, an erosion protection coating for gas turbine components. The invention is described in detail below with reference to FIG. 1.

Thus, FIG. 1 shows a very schematized cross section through a gas turbine component 10, whereby an erosion protection coating 11 according to the invention is introduced onto gas turbine component 10. The erosion protection coating 11 according to the invention provides a horizontally segmented and/or multi-layered construction, i.e., one such that relatively hard layers 12 and relatively soft layers 13 are introduced in an alternating manner onto gas turbine component 10.

The relatively hard layers 12 and the relatively soft layers 13 are thus disposed in an alternating manner on top of one another in such a way that an outer-lying layer, which forms an outer surface of erosion protection coating 11, is formed as a relatively hard layer 12.

The erosion protection coating 11 that is composed of several relatively hard layers 12 and relatively soft layers 13 that are introduced in an alternating manner is designed as a multilayer erosion protection coating.

In the sense of the present invention, both the relatively hard layers 12 as well as the relatively soft layers 13 of the erosion protection coating 11 are formed as ceramic layers.

The relatively hard layers 12 are thus preferably formed as CrAlN layers and the relatively soft layers 13 are preferably formed as CrN layers.

The layer thickness of the relatively hard, ceramic layers 12 in this case lies in an order of magnitude between 0.5 μm and 10 μm, preferably 3 μm. The layer thickness of the relatively soft, ceramic layers 13 lies in an order of magnitude between 0.5 μm and 5 μm, preferably 1 μm. The layers 12, 13 of the erosion protection coating 11 are preferably introduced onto the gas turbine component 10 by means of a PVD method.

FIGS. 2 and 3 show preferred embodiments of the relatively hard layers 12, which are constructed in turn as multilayers from layers 15 and 16 according to FIGS. 2 and 3, wherein layers 15 involve CrAlN layers and layers 16 involve CrN layers.

The layer thickness of the individual layers 15, 16 of the relatively hard layers 12 thus lies in an order of magnitude between 10 nm and 200 nm, preferably in an order of magnitude between 40 nm and 200 nm.

The relatively hard layers 12 are accordingly designed as nanostructured multilayers according to FIGS. 2 and 3. The nanostructured layers 15, 16 of the relatively hard layers 12 are preferably introduced by means of a PVD method.

As can be seen from FIGS. 2 and 3, the sequence of layers 15, 16 within the relatively hard layers 12 can be freely chosen.

The number of layers 15, 16 and thus the periodicity within the relatively hard layers 12 can also be freely selected.

In the preferred example of embodiment of FIG. 1, the erosion protection coating 11 according to the invention is introduced onto the surface of gas turbine component 10 with the intermediate disposition of a bonding layer 14. The bonding layer 14 is preferably also formed as a ceramic, i.e., made of a relatively ductile ceramic material with a low internal stress, preferably of graded CrN.

The bonding layer 14 formed as a graded CrN layer is thus softer and more ductile than the relatively soft layer 13 or each of the relatively soft layers 13 of the erosion protection coating 11, which layer(s) is/are formed as the CrN layer.

The thickness of the bonding layer 14 preferably amounts to between 0.01 μm and 0.5 μm, in particular 0.1 μm.

The invention claimed is:

1. An erosion protection coating, in particular for gas turbine components, having a horizontally segmented and/or multi-layered construction comprising:
    a plurality of first layers each having a thickness between 0.5 μm and 10 μm; each of the plurality of first layers consisting of a plurality of alternating sub-layers of CrAlN and CrN on top of one another; the top most sub-layer and the bottom most sub-layer being a CrN layer, each of the sub-layers having a thickness between 10 nm and 200 nm; each of the first layers being nanostructured in configuration;
    a plurality of second layers, each being of CrN, each having a thickness of 0.5 μm to 5 μm; the first layers being harder than the second layers;
    wherein the plurality of first layers and the plurality of second layers are disposed on top of one another in an alternating manner, in such a way that an outer-lying layer, that is farthest away from a gas turbine component receiving the coating and which forms an outer surface of the erosion protection coating, is one of the first layers.

2. A gas turbine component having an erosion protection coating introduced onto a surface thereof, wherein the erosion protection coating is formed according to claim 1.

3. The gas turbine component according to claim 2, wherein the thickness of each of the plurality of first layers is about 3 μm.

4. The gas turbine component according to claim 2, wherein the thickness of each of the plurality of second layers is about 1 μm.

5. The gas turbine component according to claim 2, wherein the erosion protection coating is introduced onto the surface of the gas turbine component with an intermediate disposition of a ceramic bonding layer.

6. The gas turbine component according to claim 5, wherein the ceramic bonding layer has a thickness between 0.01 μm and 0.5 μm.

7. The gas turbine component according to claim 5, further characterized in that the ceramic bonding layer is formed relatively ductile with a low internal stress.

8. The gas turbine component according to claim 5, wherein the ceramic bonding layer is a graded CrN layer, which is softer and more ductile than the second layers.

9. The gas turbine component according to claim 5, wherein the ceramic bonding layer has a thickness of about 0.1 μm.

10. An erosion protection coating, in particular for gas turbine components, having a horizontally segmented and/or multi-layered construction comprising:
    a plurality of first layers each having a thickness between 0.5 μm and 10 μm; each of the plurality of first layers consisting of a plurality of alternating sub-layers of CrAlN and CrN on top of one another; the top most sub-layer and the bottom most sub-layer being a CrAlN layer, each of the sub-layers having a thickness between 10 nm and 200 nm; each of the first layers being nanostructured in configuration;
    a plurality of second layers, each being of CrN, each having a thickness of 0.5 μm to 5 μm; the first layers being harder than the second layers;
    wherein the plurality of first layers and the plurality of second layers are disposed on top of one another in an alternating manner, in such a way that an outer-lying layer, that is farthest away from a gas turbine component receiving the coating and which forms an outer surface of the erosion protection coating, is one of the first layers.

11. A gas turbine component having an erosion protection coating introduced onto a surface thereof, wherein the erosion protection coating is formed according to claim 10.

12. The gas turbine component according to claim 11, wherein the thickness of each of the plurality of first layers is about 3 μm.

13. The gas turbine component according to claim 11, wherein the thickness of each of the plurality of second layers is about 1 μm.

14. The gas turbine component according to claim 11, wherein the erosion protection coating is introduced onto the surface of the gas turbine component with an intermediate disposition of a ceramic bonding layer.

15. The gas turbine component according to claim 14, wherein the ceramic bonding layer has a thickness between 0.01 μm and 0.5 μm.

16. The gas turbine component according to claim 14, further characterized in that the ceramic bonding layer is formed relatively ductile with a low internal stress.

17. The gas turbine component according to claim 14, wherein the ceramic bonding layer is a graded CrN layer, which is softer and more ductile than the second layers.

18. The gas turbine component according to claim 14, wherein the ceramic bonding layer has a thickness of about 0.1 μm.

* * * * *